United States Patent
Chen et al.

(10) Patent No.: US 11,778,891 B2
(45) Date of Patent: Oct. 3, 2023

(54) CROSSLINKED NANOPARTICLE THIN FILM, PREPARATION METHOD THEREOF, AND THIN FILM OPTOELECTRONIC DEVICE HAVING THE SAME

(71) Applicant: TCL TECHNOLOGY GROUP CORPORATION, Huizhou (CN)

(72) Inventors: Song Chen, Huizhou (CN); Lei Qian, Huizhou (CN); Yixing Yang, Huizhou (CN); Weiran Cao, Huizhou (CN); Chaoyu Xiang, Huizhou (CN)

(73) Assignee: TCL TECHNOLOGY GROUP CORPORATION, Huizhou (CN)

( * ) Notice: Subject to any disclaimer, the term of this patent is extended or adjusted under 35 U.S.C. 154(b) by 0 days.

(21) Appl. No.: 17/874,934

(22) Filed: Jul. 27, 2022

(65) Prior Publication Data
US 2022/0367812 A1 Nov. 17, 2022

Related U.S. Application Data

(62) Division of application No. 16/603,772, filed as application No. PCT/CN2018/079025 on Mar. 14, 2018, now abandoned.

(30) Foreign Application Priority Data

| Apr. 11, 2017 | (CN) | 201710232650.2 |
| Apr. 11, 2017 | (CN) | 201710232910.6 |

(Continued)

(51) Int. Cl.
*H10K 71/12* (2023.01)
*H10K 10/46* (2023.01)
(Continued)

(52) U.S. Cl.
CPC .......... *H10K 71/12* (2023.02); *H10K 10/488* (2023.02); *H10K 30/00* (2023.02); *H10K 50/16* (2023.02)

(58) Field of Classification Search
CPC ..................................... H10K 71/12
See application file for complete search history.

(56) References Cited

U.S. PATENT DOCUMENTS

| 2010/0006837 A1 | 1/2010 | Cho et al. |
| 2010/0184253 A1 | 7/2010 | Hirai et al. |

(Continued)

FOREIGN PATENT DOCUMENTS

| CN | 1802751 A | 7/2006 |
| CN | 1986645 A | 6/2007 |

(Continued)

OTHER PUBLICATIONS

The World Intellectual Property Organization (WIPO) International Search Report for PCT/CN2018/079025 dated Jun. 21, 2018 8 Pages.

(Continued)

*Primary Examiner* — Tae-Sik Kang
(74) *Attorney, Agent, or Firm* — ANOVA LAW GROUP PLLC

(57) ABSTRACT

Disclosed is a preparation method for crosslinked nanoparticle film. The preparation method comprises: dispersing nanoparticles in a solvent and uniformly mixing same, so as to obtain a nanoparticle solution; and using the nanoparticle solution to prepare a nanoparticle thin film by means of a solution method, and introducing a gas combination to promote a crosslinking reaction, so as to obtain a crosslinked nanoparticle thin film. By introducing a gas combination during film formation of nanoparticles, the present disclosure promotes the crosslinking among particles, and thus (Continued)

increases the electrical coupling among particles, lowers the potential barrier of carrier transmission, and increases the carrier mobility, thereby greatly improving the electrical properties of the thin film.

12 Claims, 9 Drawing Sheets

(30) Foreign Application Priority Data

| | | |
|---|---|---|
| Apr. 11, 2017 | (CN) | 201710232916.3 |
| Apr. 11, 2017 | (CN) | 201710232917.8 |
| Apr. 11, 2017 | (CN) | 201710233270.0 |

(51) Int. Cl.
  *H10K 30/00* (2023.01)
  *H10K 50/16* (2023.01)

(56) References Cited

U.S. PATENT DOCUMENTS

| | | | |
|---|---|---|---|
| 2013/0196469 A1* | 8/2013 | Facchetti | H01L 21/28506 |
| | | | 438/778 |
| 2015/0206957 A1 | 7/2015 | Facchetti et al. | |
| 2015/0228850 A1 | 8/2015 | Ying et al. | |
| 2016/0211392 A1 | 7/2016 | So et al. | |

FOREIGN PATENT DOCUMENTS

| | | |
|---|---|---|
| CN | 102194886 A | 9/2011 |
| CN | 102484202 A | 5/2012 |
| CN | 102909005 A | 2/2013 |
| CN | 102931289 A | 2/2013 |
| CN | 103681886 A | 3/2014 |
| CN | 103828018 A | 5/2014 |
| CN | 105493295 A | 4/2016 |
| JP | 2008075121 A | 4/2008 |
| JP | 2013062185 A | 4/2013 |
| JP | 2013533340 A | 8/2013 |
| JP | 2014516453 A | 7/2014 |
| JP | 2015149501 A | 8/2015 |
| JP | 2015231665 A | 12/2015 |
| JP | 2015534500 A | 12/2015 |
| JP | 2016503353 A | 2/2016 |
| WO | 2015190335 A1 | 12/2015 |
| WO | 2017039774 A2 | 3/2017 |

OTHER PUBLICATIONS

Ma Xin et al: "High performance hybnid near-infrared LEDs using benzenedithjol cross-linked PbS col lojdal nanocrystals",Organic Electronics, Elsevier, Amsterdam,NL,vol. 13, No. 3, Jan. 2, 2012 (Jan. 2, 2012), pp. 525-531, XP028856817,ISSN: 1566-1199,DOI: 10.1016/J.ORGEL. 2011. 12.012.

* cited by examiner

CROSSLINKED NANOPARTICLE THIN FILM, PREPARATION METHOD THEREOF, AND THIN FILM OPTOELECTRONIC DEVICE HAVING THE SAME

CROSS-REFERENCES TO RELATED APPLICATIONS

This application is divisional application of U.S. patent application Ser. No. 16/603,772, filed on Oct. 8, 2019, which is a national stage application of PCT Patent Application No. PCT/CN2018/079025, filed on Mar. 14, 2018, which claims priority to Chinese Patent Application No. 201710232917.8, filed on Apr. 11, 2017, Chinese Patent Application No. 201710233270.0, filed on Apr. 11, 2017, Chinese Patent Application No. 201710232650.2, filed on Apr. 11, 2017, Chinese Patent Application No. 201710232910.6, filed on Apr. 11, 2017, and Chinese Patent Application No. 201710232916.3, filed on Apr. 11, 2017, the content of all of which are incorporated herein by reference.

TECHNICAL FIELD

The present disclosure relates to the field of device film preparation, and in particular relates to a crosslinked nanoparticle film, a preparation method thereof and a film optoelectronic device.

BACKGROUND TECHNIQUE

Oxide nanoparticles (or spherical oxide nanocrystals) have a good crystallization, which ensures their optical and electrical properties to be similar to the bulk materials (i.e., low-dimensional materials). On the other hand, the self-assembled thin films derived from nanoparticles show good performance, which allows the application of coating preparation at low cost. In the process of fabricating optoelectronic devices by solution methods, the preparation of nanoparticles is one of the important processes for corresponding oxide films to be formed. Common examples include semiconductor materials such as zinc oxide (ZnOx) nanoparticles, thin films derived from titanium oxide (TiOx) particles, which transport electrons in light-emitting diodes, thin film solar cells, thin film transistors; and semiconductor materials such as nickel oxide (NiOx) nanoparticles, which transport holes in the same device.

Regardless, there is still a difference between thin films formed by nanoparticle deposition and thin films formed by the bulk material, which is mainly reflected on the transport properties of the carriers. Despite the good crystallinity of the interior of nanoparticles, such a structure is limited to a nanoscale; and even in the case of close-packing, nanoparticles are often filled with an insulating surface ligand or even without any fillers. Accordingly, there is a relatively high carrier transport barrier among nanoparticles, and the transport of carriers inside nanoparticle thin films can only follow the pattern of hopping transport. As a result, the carrier mobility in the dimension of thin films is much smaller than the carrier mobility in the bulk material.

Therefore, the prior art has yet to be improved and developed.

SUMMARY OF THE INVENTION

In view of the above deficiencies of the prior art, the present disclosure aims to provide a crosslinked nanoparticle thin film, a preparation method thereof and a thin film optoelectronic device, which aims to solve the problems of high transport barriers for carriers and low carrier mobility in thin films for existing devices.

The technical solution of the present invention is as follows:

A method for preparing a crosslinked nanoparticle film, comprising:

Step A: Dispersing the nanoparticles in a solvent and uniformly mixing to obtain a nanoparticle solution;

Step B: Forming a nanoparticle film by a solution method, and introducing a gas mixture to promote crosslinking reactions to obtain a crosslinked nanoparticle thin film.

The method for preparing a crosslinked nanoparticle thin film, wherein the gas mixture comprises a reduced gas, oxygen, water vapor, and carbon dioxide.

The method for preparing a crosslinked nanoparticle thin film, wherein the reduced gas bias is controlled between 1 and 100 Pa, the oxygen bias is controlled between 0 and $2\times10^4$ Pa, and the water vapor bias is controlled between 0 and $2\times10^3$ Pa, the carbon dioxide bias is controlled between 0 and 100 Pa.

The method for preparing a crosslinked nanoparticle thin film, wherein the mass concentration of the nanoparticle solution in the step A is 1 to 100 mg/ml.

The method for preparing a crosslinked nanoparticle thin film, wherein the nanoparticle is one or more of: an oxide nanoparticle, a sulfide nanoparticle, a selenide nanoparticle, a nitride nanoparticle, and a fluoride nanoparticle.

The method for preparing a crosslinked nanoparticle thin film, wherein the average diameter of the nanoparticles is controlled within 5 nm.

The method for preparing a crosslinked nanoparticle thin film, wherein the solvent is an alcohol solvent.

The method for preparing a crosslinked nanoparticle thin film, wherein the step B specifically comprises:

Step B1: First, placing the nanoparticle solution in a closed environment, and preparing nanoparticle thin films from the nanoparticle solution by a solution method;

Step B2: Introducing a gas mixture into the closed environment to promote crosslinking reactions, thereby obtaining a crosslinked nanoparticle thin film.

The method for preparing a crosslinked nanoparticle film, wherein the step B specifically comprises:

Step B1': First placing the nanoparticle solution in an inert atmosphere, and preparing the nanoparticle thin film from the nanoparticle solution by a solution method;

Step B2': Placing the nanoparticle thin film in a closed environment, and introducing a gas mixture into the closed environment to promote crosslinking reactions, thereby obtaining a crosslinked nanoparticle thin film.

The method for preparing a crosslinked nanoparticle thin film, wherein the reduced gas is one of: carbon monoxide, hydrogen, and ammonia.

The method for preparing a crosslinked nanoparticle thin film, wherein in Step B, the crosslinked nanoparticle thin film has a thickness of 15 to 60 nm.

A crosslinked nanoparticle thin film prepared by the method for preparing a crosslinked nanoparticle thin film as described above.

A thin film optoelectronic device comprising a crosslinked nanoparticle thin film as described above.

The thin film optoelectronic device, wherein the thin film optoelectronic device is any one of: an electroluminescent device, a thin film photovoltaic, a thin film photodetector, and a thin film transistor.

The thin film optoelectronic device, wherein the electroluminescent device comprises: a first electrode, a hole injection layer, a hole transport layer, a light emitting layer, an electron transport layer, and a second electrode. The material for the electron transport layer is a crosslinked nanoparticle thin film formed by the cross-linking treatment of the nanoparticle thin film.

The thin film optoelectronic device, wherein the thin film photovoltaic device comprises: a first electrode, a light-emitting layer, an electron extraction layer, and a second electrode. The material for the electron extraction layer is a crosslinked nanoparticle thin film formed by the cross-linking treatment of the nanoparticle thin film.

The thin film optoelectronic device, wherein the thin film light detector comprises: an anode, an electron blocking layer, a light absorbing layer, a hole blocking layer and a cathode. The material for the hole blocking layer is a crosslinked nanoparticle thin film formed by the cross-linking treatment of the nanoparticle thin film.

The thin film optoelectronic device, wherein the material for the semiconductor layer of the thin film transistor is a crosslinked nanoparticle thin film formed by cross-linking treatment of the nanoparticle thin film. The present disclosure has the beneficial effects: In the present disclosure, the nanoparticles are crosslinked when the nanoparticle thin film is formed, so as to increase the electrical coupling among the particles, reduce the transport barrier of carriers, increase the carrier mobility, and greatly improve the electrical performance. Accordingly, the nanoparticle thin film prepared thereof can significantly improve the performance of the thin film optoelectronic device.

DETAILED DESCRIPTION OF THE EMBODIMENTS

Figure 1:
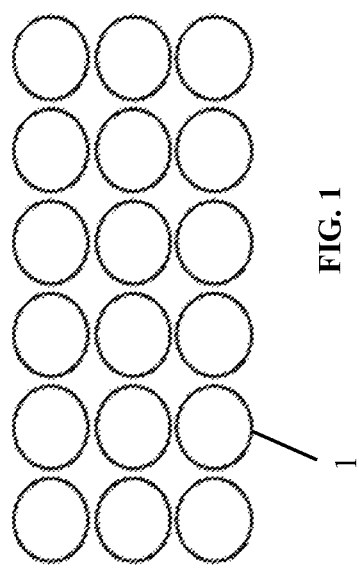
FIG. 1 is a schematic diagram showing the structure of an existing crosslinked zinc oxide nanoparticle thin film.

The present disclosure provides a crosslinked nanoparticle film, a preparation method thereof and a thin film optoelectronic device. The present disclosure will be further described in detail below in order to make the objects, technical solutions and effects of the present disclosure clear. It is understood that the specific embodiments described herein are merely illustrative examples of the present disclosure and do not limit the present disclosure.

An embodiment of the present disclosure provides a method for preparing a crosslinked nanoparticle thin film, wherein the method includes:

Step A: Dispersing nanoparticles in a solvent and uniformly mix the nanoparticles and the solvent, to obtain a nanoparticle solution.

Specifically, the step A includes: Dispersing the nanoparticles in a solvent at a mass concentration of 1 to 100 mg/ml, mix uniformly, to obtain a nanoparticle solution used for film formation by solution methods. The nanoparticles may be one or more of wide band-gap oxide nanoparticles, sulfide nanoparticles, selenide nanoparticles, nitride nanoparticles, and fluoride nanoparticles. The oxide nanoparticles may be, but not limited to one of $ZnO_x$ (e.g., $ZnO$), $TiO_x$ (e.g., $TiO_2$), etc. The sulfide nanoparticles may be, but not limited to, one of zinc sulfides and molybdenum sulfides. The selenide nanoparticles may be, but are not limited to, one of zinc selenides and lead selenides. The nitride nanoparticles may be, but not limited to, one of silicon nitrides and aluminum nitrides. The fluoride nanoparticles may be, but not limited to, one of lanthanum fluorides and sodium fluorides. In the present disclosure, the dimension of the nanoparticles may be controlled. The average diameter of the spherical nanoparticles may be limited to within 5 nm, to ensure that a sufficient amount of surface state metal atoms can participate in the reactions. The solvent may be an alcohol solvent such as a methanol, an ethanol, etc.

Step B: Preparing nanoparticle thin films by a solution method; and introducing a gas mixture to promote cross-linking reactions to obtain crosslinked nanoparticle thin films. In the present disclosure, a solution method to deposit thin films is provided, the solution method may be spin coating, ink jet printing, spray coating, or blade coating, etc.

Specifically, the gas mixture includes: a reduced gas, an oxygen, water vapor, and carbon dioxide. Preferably, the reduced gas (e.g., carbon monoxide, hydrogen or ammonia) bias pressure is controlled between 1 and 100 Pa; the oxygen bias pressure is controlled between 0 and $2\times10^4$ Pa; the water vapor bias pressure is controlled between 0 and $2\times10^3$ Pa; and the carbon dioxide bias pressure is controlled between 0 and 100 Pa. According to the present disclosure, the bias pressure of the gas mixture in contact with thin films is controlled. Preferably, such bias pressure of each gas is controlled within the above-described ranges, because the density of thin film prepared under such bias pressure ranges is higher, and accordingly, the carrier mobility in the thin films is also higher.

Figure 10:
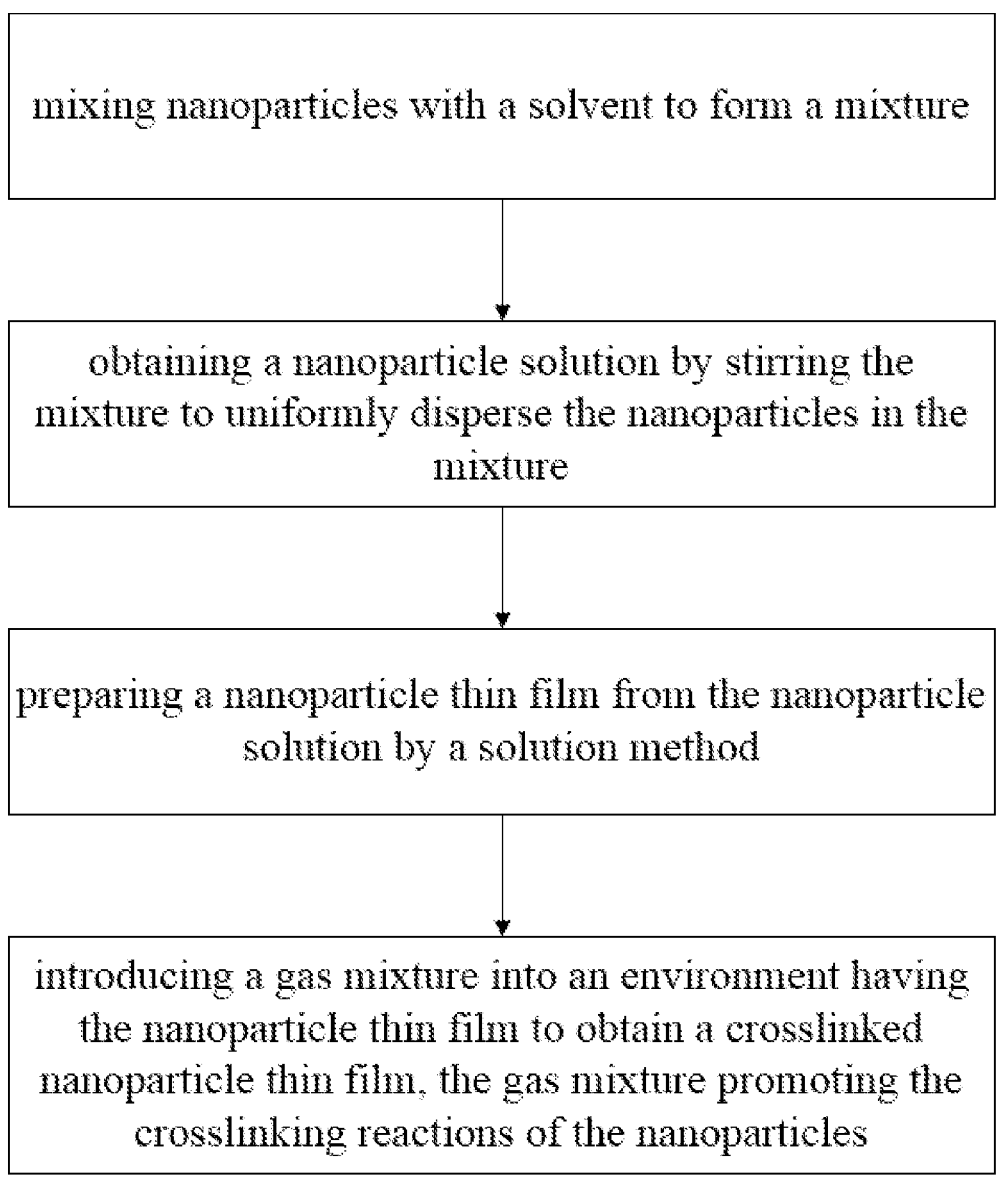
FIG. 10 is a schematic flowchart of a method for preparing crosslinked nanoparticle thin film according to the present disclosure.

FIG. 10 illustrates a similar process for preparing crosslinked nanoparticle thin film. As shown in FIG. 10, the process includes: mixing nanoparticles with a solvent to form a mixture; obtaining a nanoparticle solution by stirring the mixture to uniformly disperse the nanoparticles in the mixture; preparing a nanoparticle thin film from the nanoparticle solution by a solution method; and introducing a gas mixture into an environment having the nanoparticle thin film to obtain a crosslinked nanoparticle thin film, the gas mixture promoting the crosslinking reactions of the nanoparticles.

The conditions for crosslinking reactions for each of the above type of nanoparticles will be described in detail below.

1. Oxide Nanoparticle

When the nanoparticles are zinc oxide nanoparticles, the reduced gas (e.g., carbon monoxide, hydrogen or ammonia) bias pressure is controlled between 1 and 100 Pa; the oxygen bias pressure is controlled between 0 and $1\times10^3$ Pa; the water vapor bias pressure is controlled between 0 and $2\times10^3$ Pa; and the carbon dioxide bias pressure is controlled between 0 and 100 Pa. The density of thin films prepared under such bias pressure ranges is higher, and accordingly, the carrier electron mobility in the thin films is also higher.

When the nanoparticles are titanium oxide nanoparticles, the reduced gas (e.g., carbon monoxide, hydrogen or ammonia) bias pressure is controlled between 1 and 100 Pa; the oxygen bias pressure is controlled between 0 and $1\times10^4$ Pa; the water vapor bias pressure is controlled between 0 and $2\times10^3$ Pa; and the carbon dioxide bias pressure is controlled between 0 and 100 Pa. The density of thin films prepared under such bias ranges is higher, and accordingly, the carrier electron mobility in the thin films is also higher.

When the nanoparticles are nickel oxide nanoparticles, the reduced gas (e.g., carbon monoxide, hydrogen or ammonia) bias pressure is controlled between 1 and 100 Pa; and the oxygen bias pressure is controlled between 0 and $5\times10^3$ Pa; the water vapor bias pressure is controlled between 0 and $2\times10^3$ P; and the carbon dioxide bias pressure is controlled between 0 and 100 Pa. The density of thin films prepared under such bias pressure ranges is higher, and accordingly, the carrier electron mobility in the thin films is also higher.

2. Sulfide Nanoparticles

When the nanoparticles are zinc sulfide nanoparticles, the reduced gas (e.g., carbon monoxide, hydrogen or ammonia) bias pressure is controlled between 1 and 100 Pa; the oxygen bias pressure is controlled to be less than 0.1 Pa; the water vapor bias pressure is controlled between 0 and $2\times10^3$ Pa; and the carbon dioxide bias pressure is controlled between 0 and 100 Pa. The density of thin films prepared under such bias pressure ranges is higher, and accordingly, the carrier electron mobility in the thin films is also higher.

When the nanoparticles are molybdenum sulfide nanoparticles, the reduced gas (e.g., carbon monoxide, hydrogen or ammonia) bias pressure is controlled between 1 and 100 Pa; the oxygen bias pressure is controlled to be less than 0.1 Pa; the water vapor bias pressure is controlled between 0 and $2\times10^3$ Pa; and the carbon dioxide bias pressure is controlled between 0 and 100 Pa. The density of thin film under such bias pressure ranges is higher, and accordingly, the carrier electron mobility in the thin films is also higher.

3. Selenide Nanoparticles

When the nanoparticles are zinc selenide nanoparticles, the reduced gas (e.g., carbon monoxide, hydrogen or ammonia) bias pressure is controlled between 1 and 100 Pa; the oxygen bias pressure is controlled to be less than 0.1 Pa; the water vapor bias pressure is controlled between 0 and $1\times10^2$ Pa; and the carbon dioxide bias pressure is controlled between 0 and 10 Pa. The density of thin films produced under this bias pressure ranges is higher, and accordingly, the carrier electron mobility in the thin films is also higher.

When the nanoparticles are lead selenide nanoparticles, the reduced gas (e.g., carbon monoxide, hydrogen or ammonia) bias pressure is controlled between 1 and 100 Pa; the oxygen bias pressure is controlled to be less than 0.1 Pa; the water vapor bias pressure is controlled to be less than 0.1 Pa, carbon dioxide bias pressure is controlled between 0 and 100 Pa. The density of thin films produced under such bias pressure ranges is higher, and accordingly, the carrier electron mobility in the thin films is also higher.

4. Nitride Nanoparticles

When the nanoparticles are silicon nitride nanoparticles, the reduced gas (e.g., carbon monoxide, hydrogen or ammonia) bias pressure is controlled between 1 and 100 Pa; the oxygen bias pressure is controlled at 0.1 and 1 Pa; the water vapor bias pressure is controlled between 0 and $2\times10^3$ Pa; and the carbon dioxide bias pressure is controlled between 0 and 100 Pa. Additionally, the nitrogen gas bias pressure is maintained at about $1\times10^5$ Pa. The density of thin films prepared under such bias pressure ranges is higher, and accordingly, the carrier electron mobility in thin films is also higher.

When the nanoparticles are aluminum nitride nanoparticles, the reduced gas (e.g., carbon monoxide, hydrogen or ammonia) bias pressure is controlled between 1 and 100 Pa; the oxygen bias pressure is controlled to be less than 0.1 Pa; the water vapor bias pressure is controlled between 0 and $2\times10^3$ Pa; and the carbon dioxide bias pressure is controlled between 10 and 100 Pa. Additionally, the nitrogen gas bias pressure is maintained at about $1\times10\ 5$ Pa. The density of thin film prepared under such bias pressure ranges is higher, and accordingly, the carrier electron mobility in the thin films is also higher.

5. Fluoride Nanoparticles

When the nanoparticles are lanthanum fluoride nanoparticles, the reduced gas (e.g., carbon monoxide, hydrogen or ammonia) bias pressure is controlled between 1 and 100 Pa; the oxygen bias pressure is controlled to be less than 0.1 Pa; the water vapor bias pressure is controlled between 0 and $1\times10^2$ Pa; and the carbon dioxide bias pressure is controlled between 0 and 10 Pa. The density of thin films prepared under such bias pressure ranges is higher, and accordingly, the carrier electron mobility in the thin films is also higher.

When the nanoparticles are sodium fluoride nanoparticles, the reduced gas (e.g., carbon monoxide, hydrogen or ammonia) bias pressure is controlled between 1 and 100 Pa; the oxygen bias pressure is controlled to be less than 0.1 Pa; the water vapor bias pressure is controlled between 0 and $2\times10^3$ Pa; and the carbon dioxide bias is controlled between 10 and 100 Pa. The density of thin films prepared under such bias pressure ranges is higher, and accordingly, the carrier electron mobility in the thin films is also higher.

In the present disclosure, the nanoparticles are crosslinked during thin film formation. Cross-links are chemical bonds that connect nanoparticles, among which there are fillers. In contrast, there is no material linked by chemical bonds between the uncrosslinked nanoparticles. The crosslinking method of the present disclosure can increase the density and carrier mobility in the corresponding thin films.

In the present disclosure, nanoparticle films can be prepared directly from a nanoparticle solution under a non-vacuum condition. Specifically, the step B includes:

Step B1: Placing a nanoparticle solution in a closed environment, and preparing nanoparticle thin films by a solution method; and Step B2: Introducing a gas mixture into the closed environment, to promote crosslinking reactions, to obtain crosslinked nanoparticles.

In the foregoing described embodiments, nanoparticle thin films are prepared from a nanoparticle solution under a closed non-vacuum condition. The above-mentioned gas mixture is then introduced to the closed environment, to promote crosslinking reactions, to obtain crosslinked nanoparticle thin films.

The preparation of crosslinked nanoparticle thin films of the present disclosure is not limited to the above-mentioned environment. The nanoparticle thin films can be prepared under an inert atmosphere, and then be placed in a closed environment. The closed environment is then introduced a gas mixture, to promote the crosslinking reactions, to obtain nanoparticle thin films. Specifically, the Step B includes:

Step B1': Placing the nanoparticle solution in an inert atmosphere and preparing nanoparticle thin films by a solution method; and Step B2': Placing the nanoparticle thin film in a closed environment, and introducing a gas mixture into the closed environment, to promote crosslinking reactions, to obtain crosslinked nanoparticle thin films.

In the present disclosure, after the crosslinking reactions, the crosslinked nanoparticle thin films are dried to finally obtain crosslinked nanoparticle thin film having a thickness of 15 to 60 nm. The drying temperature is higher than the boiling point of the solvent in the nanoparticle solution; according to the thickness of the film, the drying time is more than 15 minutes per 50 nm.

The present disclosure also provides a crosslinked nanoparticle thin films prepared by any of the above methods for preparing crosslinked nanoparticle thin films.

Usually, a nanoparticle thin film is self-assembled from nanoparticles that are not crosslinked to each other. In the present disclosure, during thin film formation of the nanoparticles, a gas mixture is introduced to promote crosslinking among the particles, thereby increasing electrical coupling between the particles, reducing the transport barrier of carriers, increasing carrier mobility, and accordingly, improving the electrical performance. The application of the obtained crosslinked nanoparticle thin films in light-emitting diodes, thin film solar cells, light detectors, and thin film transistors prepared by solution methods can significantly improve the performance of these devices.

Figure 2:
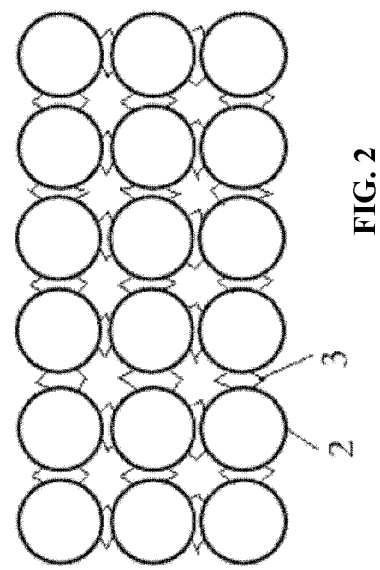
FIG. 2 is a schematic diagram showing the structure of a crosslinked zinc oxide nanoparticle thin film prepared by the method of the present disclosure.
Figure 3:
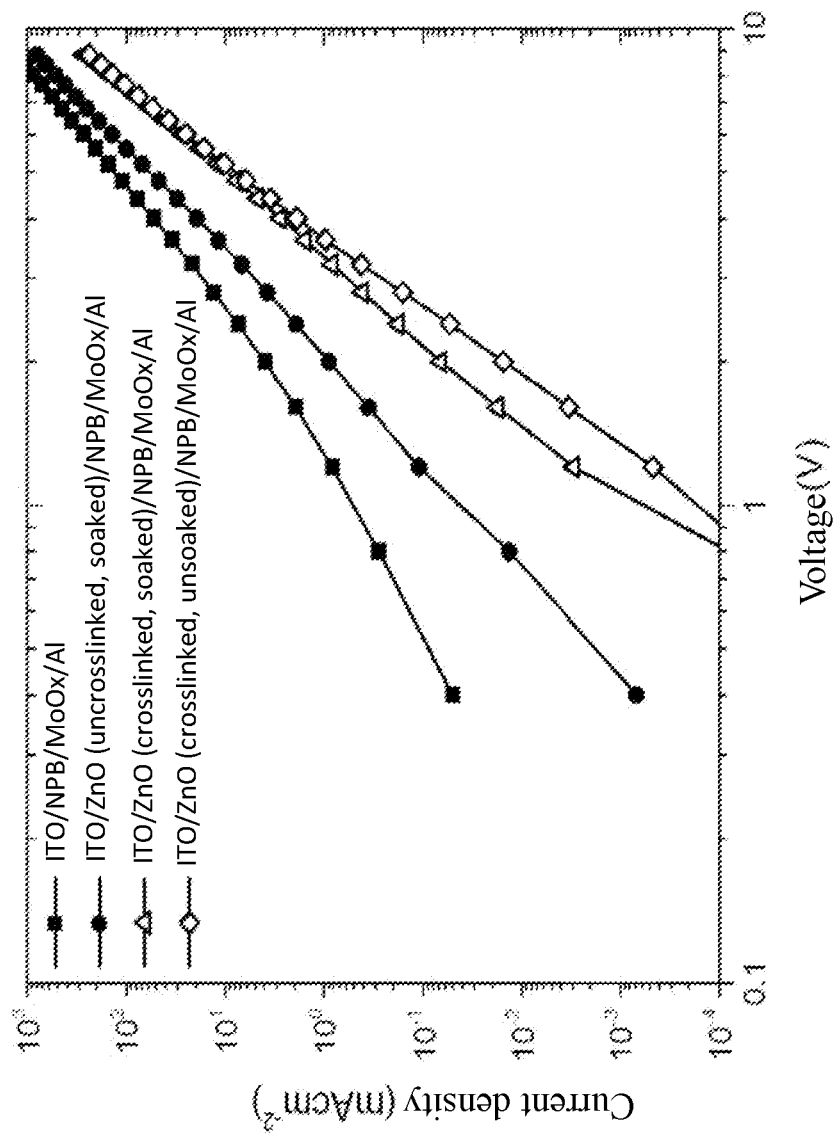
FIG. 3 is a diagram showing the current-voltage curves for devices composed of ITO/NPB/MoOx/Al with different thin films.

Below is an illustrative example of zinc oxide nanoparticles, and the properties of the existing uncrosslinked zinc oxide nanoparticle thin films and the properties of the crosslinked zinc oxide nanoparticle thin films prepared by the methods of the present disclosure are tested. Referring to FIGS. 1-3, FIG. 1 is a schematic diagram of the structure of an existing uncrosslinked zinc oxide nanoparticle thin film, FIG. 2 is a schematic diagram of the structure of a crosslinked zinc oxide nanoparticle thin film prepared by a method of the present disclosure, FIG. 3 is a diagram showing the current-voltage curves for ITO/NPB/MoOx/Al devices with different thin films. As shown in FIG. 1, there is no substance connected by chemical bonds between the uncrosslinked nanoparticles 1. It can be seen in FIG. 2, there are fillers 3 among nanoparticles 2, and nanoparticles 2 are connected by chemical bonds. Since the added zinc oxide has an effective inhibition on the current of the devices composed of ITO/NPB/MoOx/Al structure, it can be determined whether the ZnO nanoparticle thin film may detach during the soaking process by observing whether the current is increased. As shown in FIG. 3, the current of the crosslinked ZnO nanoparticle thin film is kept at a low value regardless of whether it is soaked in an alcohol solvent (e.g., ethanol), which indicates that ZnO nanoparticle thin film does not detach during soaking, which results in an apparent inhibitory effect on the current of the ITO/NPB/MoOx/Al structure by ZnO. However, the current is significantly increased when the uncrosslinked ZnO nanoparticle thin film is soaked in an alcohol solvent (e.g., ethanol), which indicates that the uncrosslinked ZnO nanoparticle thin film detaches during soaking, so that the current of the responsive devices is significantly increased, very close to the current of the devices without adding ZnO nanoparticle thin film. Therefore, the crosslinked zinc oxide nanoparticle thin film obtained by crosslinking reactions does not dissolve or have any detachment after soaking in the original solvent (e.g., a solvent used for dispersing zinc oxide nanoparticles, usually, i.e., an alcohol solvent). On the contrary, the uncrosslinked nanoparticle thin film can easily detach after soaking.

The present disclosure also provides a thin film optoelectronic device, wherein the thin film optoelectronic device includes a crosslinked nanoparticle thin film. Specifically, the thin film optoelectronic device is any one of: an electroluminescent device, a thin film photovoltaic device, a thin film light detector, and a thin film transistor.

Figure 4:
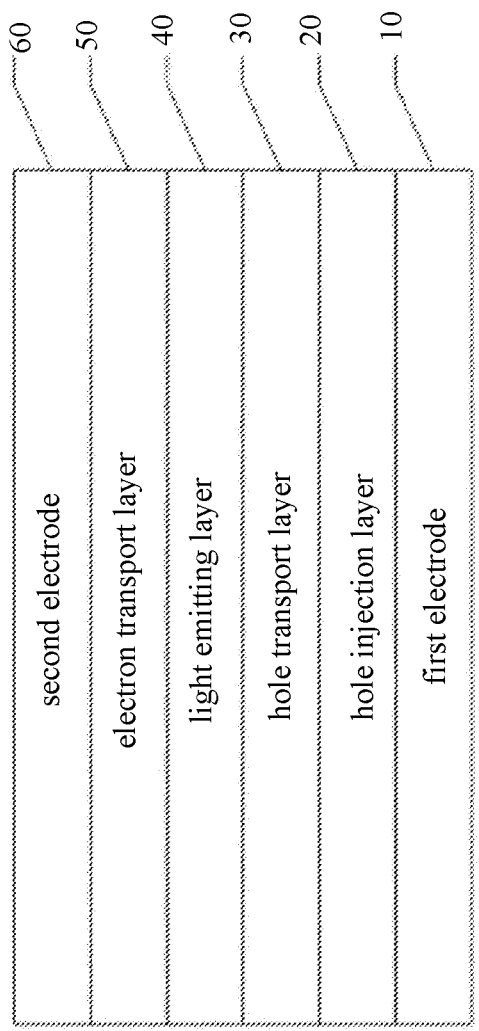
FIG. 4 is a schematic structural diagram of an embodiment of a thin film electroluminescent device among the embodiments of the thin film optoelectronic devices of the present disclosure.

As a specific embodiment of the optoelectronic thin film device, as shown in FIG. 4, an electroluminescent device includes sequentially: a first electrode 10, a hole injection layer 20, a hole transport layer 30, a light emitting layer 40, an electron transport layer 50, and the second electrode 60. The material of the electron transport layer 50 is a crosslinked nanoparticle thin film formed from crosslinking reactions.

In the electroluminescent device of the present embodiment, at least one of the first electrode and the second electrode has high light transmittance for a light band emitted by the light emitting layer. Specifically, the material for the first electrode is selected from one or more of: indium-doped tin oxide (ITO), fluorine-doped tin oxide (FTO), antimony doped tin oxide (ATO), aluminum-doped zinc oxide (AZO); preferably, the first electrode is an ITO electrode.

Further, in the present embodiment, the material for the hole transport layer 430 is selected from the materials or the materials with the chemical groups: poly[bis(4-phenyl)(4-butylphenyl)amine], 4-butyl-N,N-diphenylaniline homopolymer, aniline, 4-butyl-N,N-diphenyl, homopolymer (poly-TPD), poly(9,9-dioctylfluorene-CO—N-(4-butylphenyl)-diphenylamine) (TFB), poly(9-vinylcarbazole) (PVK), TPD, Spiro-TPD, LG101, HAT-CN, PEDOT: PSS, TAPC, a-NPB, m-MTDATA, $Ni_xO$, $MoO_x$, $VO_x$, $WO_x$ and a mixture thereof; preferably, the hole transport layer 30 is a poly-TPD layer and has a thickness of 10 to 100 nm.

Further, in the present embodiment, the material for the quantum dot light-emitting layer includes but not limited to: nanocrystals of II-VI semiconductor, for example, CdS, CdSe, CdTe, ZnS, ZnSe, ZnTe, HgS, HgSe, HgTe, PbS, PbSe, PbTe and other binary, ternary, or quaternary II-VI compounds; III-V semiconductor nanocrystals, for example, GaP, GaAs, InP, InAs or other binary, ternary, or quaternary III-V compounds. The quantum dot luminescent material for electroluminescence is not limited to II-V compounds, III-VI compounds, IV-VI compounds, I-III-VI compounds, II-IV-VI compound, or group IV elements.

Further, in the present embodiment, the material for the second electrode is selected from: Al, Ag, Cu, Mo, Au, or an alloy thereof; preferably, the material for the second electrode is Au. The second electrode has a thickness of 50 to 500 nm; preferably, the second electrode has a thickness of 100 to 200 nm.

Figure 5:
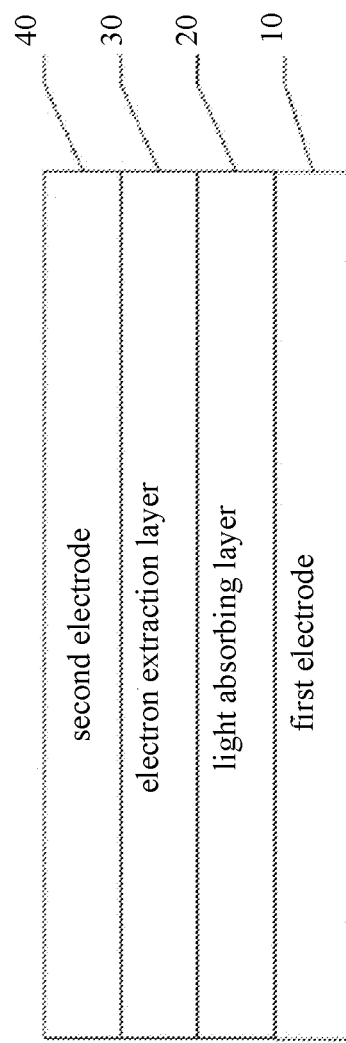
FIG. 5 is a schematic structural diagram of an embodiment of a thin film photovoltaic device among the embodiments of the thin film optoelectronic devices of the present disclosure.

As a specific embodiment of the thin film optoelectronic device, as shown in FIG. 5, the thin film photovoltaic device includes: a first electrode 10, a light absorbing layer 20, an electron extraction layer 30, and a second electrode 40. The material for the electron extraction layer 30 is a crosslinked nanoparticle thin film formed by crosslinking reactions in a nanoparticle thin film.

In the present embodiment of the thin film photovoltaic device, at least one of the first electrode and the second electrode has high sunlight transmittance. Specifically, the first electrode is selected from one or more of: indium-doped tin oxide (ITO), fluorine-doped tin oxide (FTO), antimony-doped tin oxide (ATO), and aluminum-doped zinc oxide (AZO); preferably, the material for the first electrode is ITO.

Further, according to the present embodiment, the light absorbing layer may be a semiconductor homojunction or a heterojunction. The material for the light absorbing layer is a light absorbing material in a solar spectrum, and may include: polymer photovoltaic material; organic small molecule photovoltaic material; halogen-containing perovskite photovoltaic material; chalcopyrite structural material (e.g., copper indium gallium selenide); II-VI compound material (e.g., thin films and nanocrystals); single crystal, polycrystalline, or amorphous silicon. If the light absorbing layer is a homojunction, the light absorbing layer includes a specific material of one material category from above; if the light absorbing layer is a heterojunction, the light absorbing layer includes two specific materials from one or two material categories from above.

Further, in the present embodiment, the material for the second electrode is selected from: Al, Ag, Cu, Mo, Au, or an alloy thereof; preferably, the material for the second electrode is Au. The second electrode has a thickness of 50 to 500 nm; preferably, the second electrode has a thickness of 100 to 200 nm.

Figure 6:
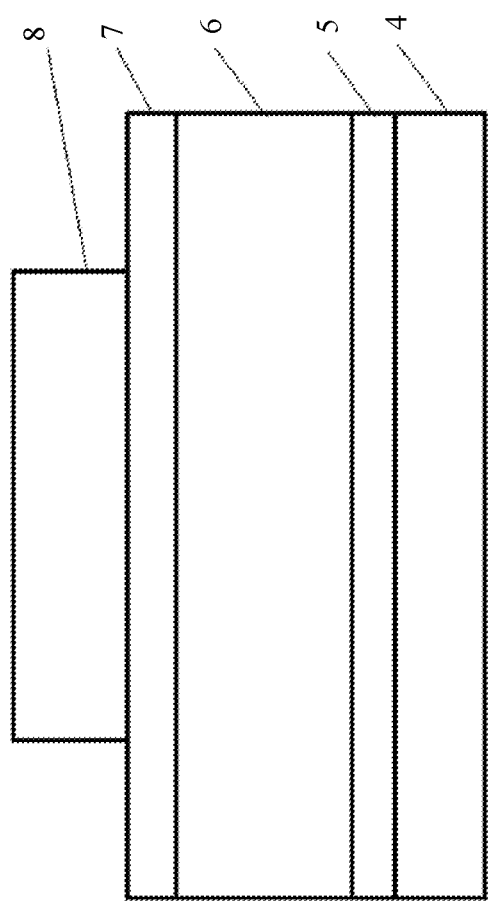
FIG. 6 is a schematic structural diagram of an embodiment of a thin film light detector device among the embodiments of the thin film optoelectronic devices of the present disclosure.

As a specific embodiment of the thin film optoelectronic device, as shown in FIG. 6, the thin film light detector includes sequentially: an anode 4, an electron blocking layer 5, a light absorbing layer 6, a hole blocking layer 7, and a cathode 8. The material of the hole blocking layer 7 is a crosslinked nanoparticle thin film obtained by crosslinking reactions in a nanoparticle thin film.

According to the present embodiment of the thin film light detector, at least one of the anode and the cathode has high transmittance for the detection band.

Further, in the present embodiment, the material for the anode is selected one or more of indium-doped tin oxide (ITO), fluorine-doped tin oxide (FTO), antimony-doped tin oxide (ATO), and aluminum-doped zinc oxide (AZO); preferably, the material for the anode is ITO.

Further, in the present embodiment, the material for the electron blocking layer is selected from: poly(9,9-dioctylfluorene-CO—N-(4-butylphenyl)-diphenylamine) (TFB), polyvinylcarbazole (PVK), poly(N,N' bis(4-butylphenyl)-N,N'-bis(phenyl)benzidine) (poly-TPD), poly(9,9-dioctylfluorene-co-bis-N,N-phenyl-1,4-phenylenediamine) (PFB), 4,4',4''-tris(carbazol-9-yl)-triphenylamine (TCTA), 4,4'-bis(9-carbazole)-biphenyl (CBP), N,N'-diphenyl-N,N'-bis(3-methylphenyl)-1,1'-biphenyl-4,4'-diamine (TPD), N,N'-diphenyl-N,N'-(1-naphthyl)-1,1'-biphenyl-4,4'-diamine (NPB), doped graphene, undoped graphene, C60, or a mixture thereof; preferably, the material for the electron blocking layer 5 is poly-TPD. The electron blocking layer 620 has a thickness of 10 to 100 nm.

Further, in the present embodiment, the material for the light absorbing layer is one or more of: a binary III-V compound (e.g., GaN, GaAs or InGaAs); a multinary III-V compound; a nanocrystal of a II-VI compound material, an organic semiconductor material; a halogen-containing perovskite material; a chalcopyrite structural material (e.g., copper indium gallium selenide); a single crystal, polycrystalline, or amorphous silicon. The light absorbing layer (photoelectron generating layer) may be a semiconductor homojunction or a semiconductor heterojunction. Specifically, in some embodiments, if the light absorbing layer is a homojunction, the material for the light absorbing layer is one specific material of a material category from above. Specifically, if the light absorbing layer is a heterojunction, the material for the light absorbing layer are two specific materials of one or two material category from above.

Further, in the present embodiment, the cathode material is selected from: Al, Ag, Cu, Mo, Au, or an alloy thereof; preferably, the cathode material is Au. The cathode has a thickness of 50 to 500 nm. In some embodiments, the cathode has a thickness of 100 to 200 nm; preferably, the thin film light detector is partially packaged, fully packaged, or unpackaged.

Figure 7A:
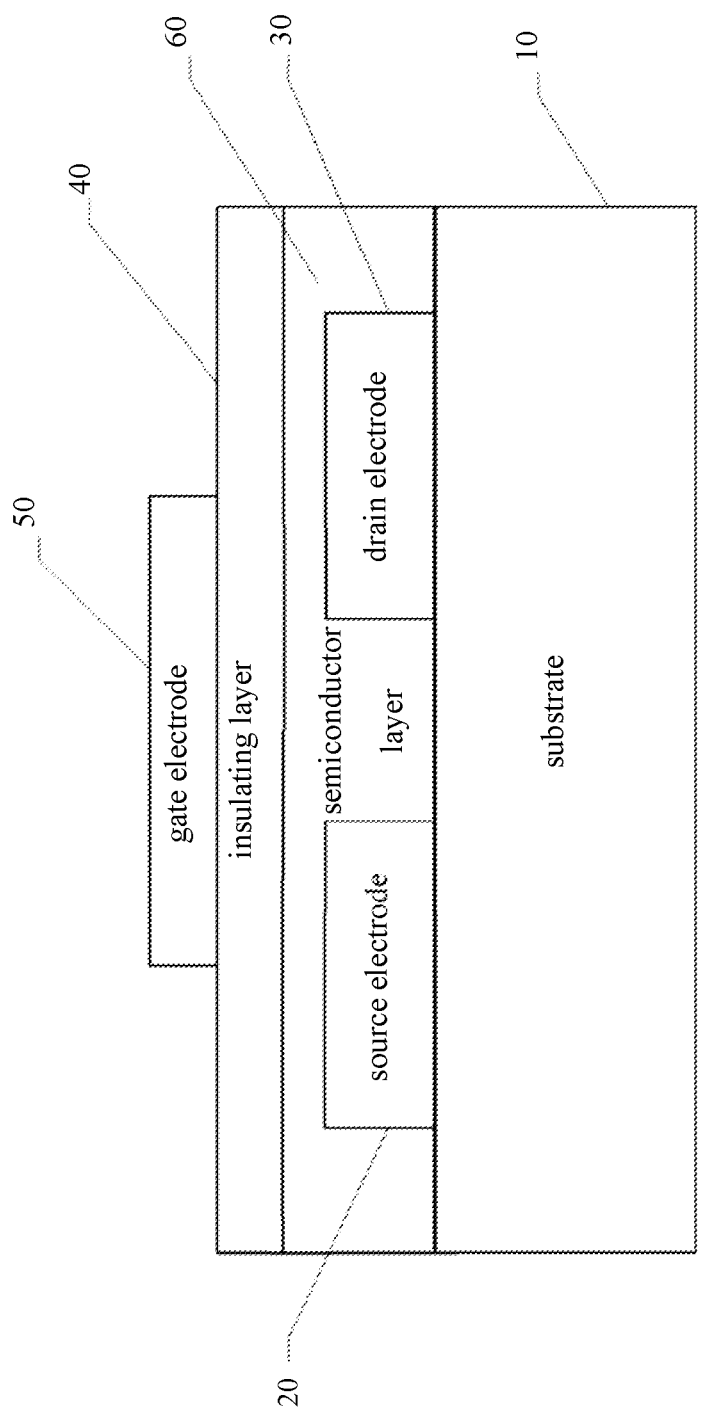
FIG. 7a is a first schematic structural diagram of an embodiment of a thin film transistor among the embodiments of the thin film optoelectronic devices of the present disclosure.
Figure 7B:
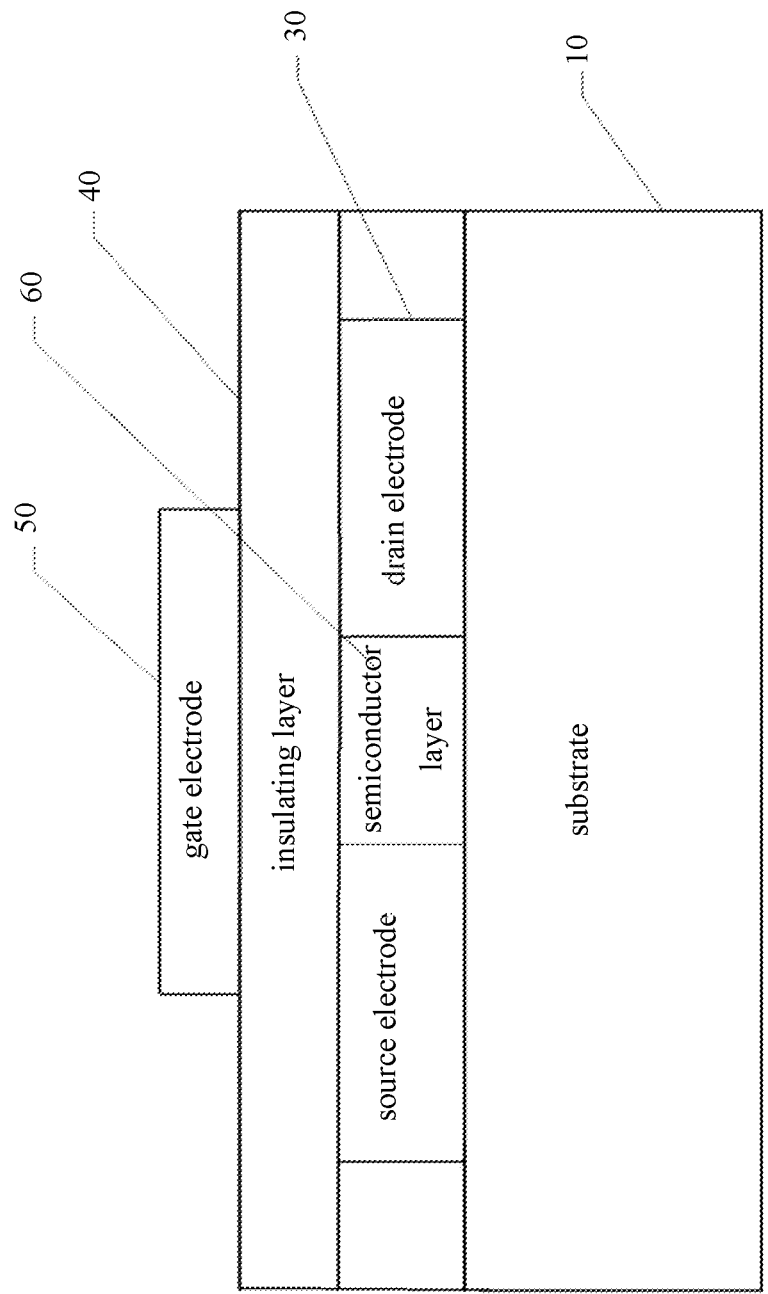
FIG. 7b is a second schematic structural diagram of an embodiment of a thin film transistor among the embodiments of the thin film optoelectronic devices of the present disclosure.

As a specific embodiment of the thin film optoelectronic device, as shown in FIG. 7a, the semiconductor layer material of the thin film transistor is a crosslinked nanoparticle thin film formed by crosslinking reactions in a nanoparticle thin film. The thin film transistor includes: a substrate 10, a source electrode 20 disposed on the substrate 10, a drain electrode 30, an insulating layer 40 disposed on the source electrode 20 and the drain electrode 30, a gate electrode 50 disposed on the insulating layer 40, and a semiconductor layer 60 disposed on the substrate 10. The source electrode 20 and the drain electrode 30 are separated by the semiconductor layer 60. Specifically, the semiconductor layer 60 has a thickness greater than a thickness of the source electrode or a thickness of the drain electrode (as shown in FIG. 7a); the semiconductor layer 60 has a thickness consistent with the thickness of the source electrode 20 or the thickness of the drain electrode 30 (as shown in FIG. 7b).

Figure 8:
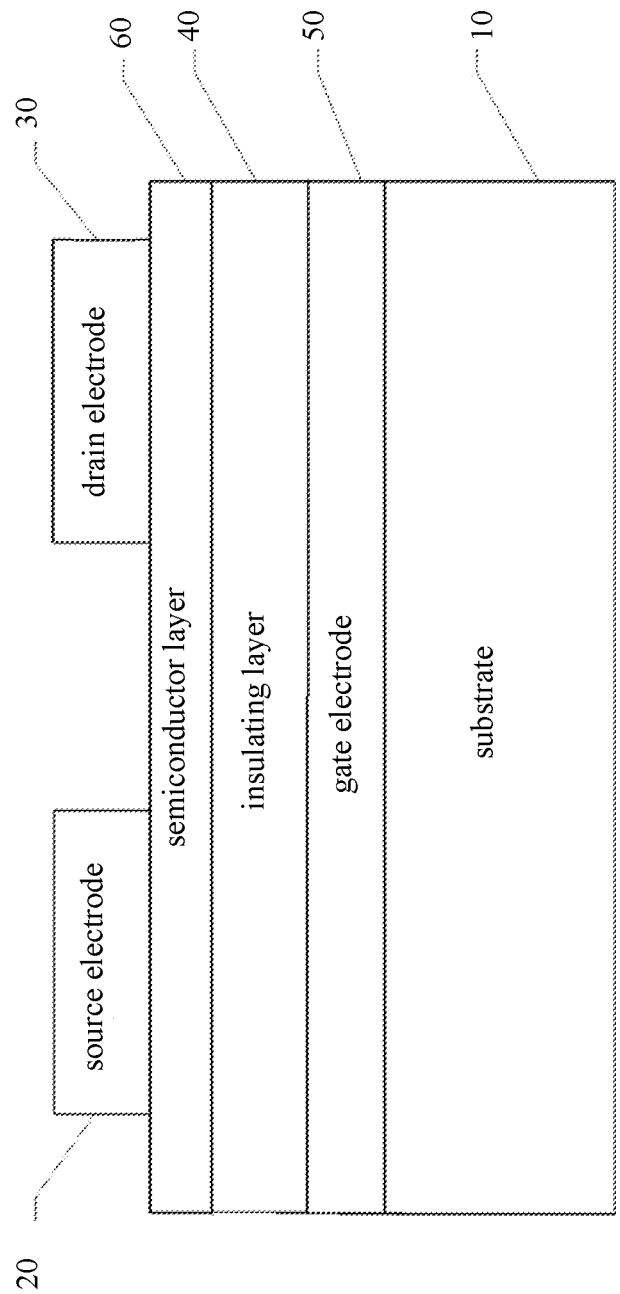
FIG. 8 is a third schematic structural diagram of an embodiment of a thin film transistor among the embodiments of the thin film optoelectronic devices of the present disclosure.

Further, as shown in FIG. 8, the thin film transistor may also be configured to include: a substrate, a gate electrode, an insulating layer and a semiconductor layer, which are sequentially stacked from bottom to top. The semiconductor layer is configured to include a source electrode and a drain electrode; the source electrode and the drain electrode are separated from each other.

Figure 9:
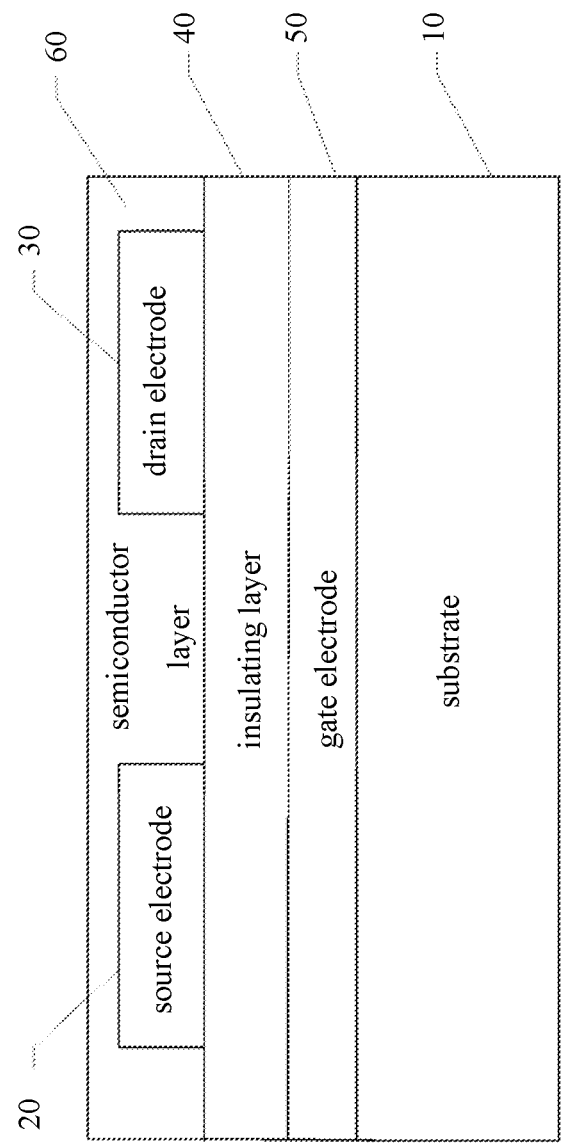
FIG. 9 is a fourth schematic structural diagram of an embodiment of a thin film transistor among the embodiments of the thin film optoelectronic devices of the present disclosure.

Or, as shown in FIG. 9, the thin film transistor may be configured to include: a substrate, a gate electrode, an insulating layer and a semiconductor layer, which are sequentially stacked from bottom to top. The insulating layer is configured to include a source electrode and a drain electrode; the source electrode and the drain electrode are disposed in the interior of the semiconductor layer, and are separated by the semiconductor layer.

In the present embodiment of the thin film transistor, the material for the source electrode, the drain electrode, and the gate electrode may be a metal or a semiconductor having high conductivity. The material for the insulating layer may be a dielectric material, for example, an oxide, or a nitride.

In summary, the present disclosure provides a crosslinked nanoparticle thin film, a preparation method thereof and a thin film optoelectronic device. In the present disclosure, a gas mixture is introduced during the nanoparticle thin film formation, to promote crosslinking among the particles, which increases the electrical coupling between the particles, reduces the transport barrier of carriers, increases the carrier mobility, and accordingly, greatly improves the electrical performance. The application of the obtained crosslinked nanoparticle thin films in electroluminescent device prepared by solution methods, as electron transport layer, can apparently improve carrier balance, luminous efficiency and lifetime of the device. The application of the obtained crosslinked nanoparticle thin films in photovoltaic devices prepared by solution methods, as electron transport layer, can significantly reduce the linear resistance of the device, improve the parallel resistance, and improve the energy conversion efficiency of the device. The application of the obtained crosslinked nanoparticle thin films in thin film light detector prepared by solution methods, as electron extraction layer and hole blocking layer, can reduce the current and improve the detection rate. The application of the obtained crosslinked nanoparticle thin films in thin film transistor prepared by solution methods, can improve the carrier mobility of the semiconductor layer, increase the source-drain current, and increase the response frequency.

It is to be understood that the application of the present disclosure is not limited to the foregoing described examples, and those skilled in the art can make modifications and variations in accordance with the above descriptions, all of which are within the scope of the appended claims.

What is claimed is:

1. A method for preparing crosslinked nanoparticle film, comprising:
   mixing nanoparticles with a solvent to form a mixture;
   obtaining a nanoparticle solution by stirring the mixture to uniformly disperse the nanoparticles in the mixture;
   preparing a nanoparticle film from the nanoparticle solution by a solution method; and
   introducing a gas mixture into an environment having the nanoparticle film to obtain a crosslinked nanoparticle film, the gas mixture promoting the crosslinking reactions of the nanoparticles,
   wherein:
   the gas mixture comprises a reduced gas, oxygen, water vapor and carbon dioxide; and
   a bias pressure for the reduced gas is between 1 and 100 Pa.

2. The method for preparing the crosslinked nanoparticle film according to claim 1, wherein a bias pressure for the oxygen is between 0 and $2\times10^4$ Pa.

3. The method for preparing the crosslinked nanoparticle film according to claim 1, wherein the nanoparticle solution has a mass concentration of 1 to 100 mg/ml.

4. The method for preparing the crosslinked nanoparticle film according to claim 1, wherein the nanoparticles are one or more of: oxide nanoparticles, sulfide nanoparticles, selenide nanoparticles, nitride nanoparticles, and fluoride nanoparticles.

5. The method for preparing the crosslinked nanoparticle film according to claim 1, wherein an average diameter of the nanoparticles is within 5 nm.

6. The method for preparing the crosslinked nanoparticle film according to claim 1, wherein the solvent is an alcohol solvent.

7. The method for preparing the crosslinked nanoparticle film according to claim 1, wherein the reduced gas is one of: carbon monoxide, hydrogen, and ammonia.

8. The method for preparing the crosslinked nanoparticle film according to claim 1, wherein the crosslinked nanoparticle film has a thickness of 15 to 60 nm.

9. The method for preparing the crosslinked nanoparticle film according to claim 1, wherein the nanoparticle film is prepared from the nanoparticle solution by the solution method in a closed environment and/or an inert atmosphere and the environment having the nanoparticle film is a closed environment.

10. The method for preparing the crosslinked nanoparticle film according to claim 1, wherein the solution method is a chemical solution deposition for fabricating films,
    wherein a solution is deposited on a substrate via spin coating, ink jet printing, spray coating, or blade coating.

11. The method for preparing the crosslinked nanoparticle film according to claim 1, wherein a bias pressure for the water vapor is between 0 and $2\times10^3$ Pa.

12. The method for preparing the crosslinked nanoparticle film according to claim 1, wherein a bias pressure for the carbon dioxide is between 0 and 100 Pa.

* * * * *